(12) United States Patent
Pohjonen et al.

(10) Patent No.: US 10,665,724 B2
(45) Date of Patent: May 26, 2020

(54) METHOD AND APPARATUS FOR PROVIDING A TRANSISTOR

(71) Applicant: LytEn, Inc., Sunnyvale, CA (US)

(72) Inventors: Katri Pohjonen, Espoo (FI); Sami Kallioinen, Espoo (FI); Markku Rouvala, Helsinki (FI)

(73) Assignee: LytEn, Inc., Sunnyvale, CA (US)

( * ) Notice: Subject to any disclaimer, the term of this patent is extended or adjusted under 35 U.S.C. 154(b) by 0 days.

(21) Appl. No.: 15/560,278

(22) PCT Filed: Mar. 3, 2016

(86) PCT No.: PCT/FI2016/050131
§ 371 (c)(1),
(2) Date: Sep. 21, 2017

(87) PCT Pub. No.: WO2016/156661
PCT Pub. Date: Oct. 6, 2016

(65) Prior Publication Data
US 2018/0090622 A1    Mar. 29, 2018

(30) Foreign Application Priority Data

Mar. 30, 2015 (EP) .................................... 15161755

(51) Int. Cl.
*H01L 29/786* (2006.01)
*H01L 29/16* (2006.01)
(Continued)

(52) U.S. Cl.
CPC .... *H01L 29/78636* (2013.01); *H01L 21/6835* (2013.01); *H01L 24/19* (2013.01); *H01L 24/20* (2013.01); *H01L 24/24* (2013.01); *H01L 29/1606* (2013.01); *H01L 29/66045* (2013.01); *H01L 29/66742* (2013.01); *H01L 29/778* (2013.01); *H01L 29/78603* (2013.01); *H01L 29/78684* (2013.01); *H01L 29/78696* (2013.01);
(Continued)

(58) Field of Classification Search
CPC .................................................. H01L 29/1606
See application file for complete search history.

(56) References Cited

U.S. PATENT DOCUMENTS 8,389,333 B2    3/2013 Camacho
8,421,131 B2    4/2013 Chung et al.
(Continued)

OTHER PUBLICATIONS

"Creative Thinking", Nanium, Retrieved on Sep. 26, 2017, Webpage available at : http://www.nanium.com/.
(Continued)

*Primary Examiner* — Abul Kalam
(74) *Attorney, Agent, or Firm* — Paradice and Li LLP (57) ABSTRACT

A method and apparatus wherein the method comprises: providing at least one electrode within a semiconductor layer wherein the semiconductor layer is provided on a first side of a wafer; thinning the wafer to produce a thinned wafer; providing graphene on a second side of the thinned wafer; attaching the semiconductor layer to an electrical interface on the first side of the thinned wafer; and providing at least one electrical connection from the graphene to the electrical interface so as to form a transistor comprising the at least one electrode and the graphene.

10 Claims, 4 Drawing Sheets

(51) Int. Cl.
| | |
|---|---|
| H01L 29/66 | (2006.01) |
| H01L 31/112 | (2006.01) |
| H01L 31/028 | (2006.01) |
| H01L 31/0203 | (2014.01) |
| H01L 31/0352 | (2006.01) |
| H01L 23/00 | (2006.01) |
| H01L 21/683 | (2006.01) |
| H01L 29/778 | (2006.01) |
| H01L 51/05 | (2006.01) |
| H01L 27/06 | (2006.01) |

(52) U.S. Cl.
CPC ........ *H01L 31/0203* (2013.01); *H01L 31/028* (2013.01); *H01L 31/035209* (2013.01); *H01L 31/112* (2013.01); *H01L 51/0558* (2013.01); *H01L 27/0694* (2013.01); *H01L 2224/04105* (2013.01); *H01L 2224/06181* (2013.01); *H01L 2224/12105* (2013.01); *H01L 2224/24226* (2013.01); *H01L 2224/2518* (2013.01); *H01L 2924/10253* (2013.01); *H01L 2924/10272* (2013.01); *H01L 2924/10329* (2013.01); *H01L 2924/13072* (2013.01); *H01L 2924/14* (2013.01); *H01L 2924/1433* (2013.01); *H01L 2924/15174* (2013.01); *H01L 2924/15311* (2013.01); *Y02E 10/547* (2013.01)

(56) References Cited

U.S. PATENT DOCUMENTS

| | | | |
|---|---|---|---|
| 8,466,997 | B2 | 6/2013 | Goh et al. |
| 8,673,703 | B2 | 3/2014 | Lin et al. |
| 8,759,153 | B2 | 6/2014 | Elian et al. |
| 8,779,601 | B2 | 7/2014 | Gan et al. |
| 2010/0006823 | A1 | 1/2010 | Andreson et al. |
| 2013/0302940 | A1* | 11/2013 | Avouris ................ B82Y 10/00 438/108 |
| 2014/0353589 | A1 | 12/2014 | Cao et al. |
| 2015/0364545 | A1* | 12/2015 | Heo .................... H01L 29/1033 257/24 |

OTHER PUBLICATIONS

"Quantum Dots Boost Graphene's Photodetector Dreams", ZDNet, Retrieved on Sep. 26, 2017, Webpage available at : http://www.zdnet.com/article/quantum-dots-boost-graphenes-photodetector-dreams/.

Konstantatos et al., "Hybrid Graphene—Quantum Dot Phototransistors With Ultrahigh Gain", Nature Nanotechnology, vol. 7, No. 6, May 6, 2012, pp. 1-6.

Fan-Out Wafer Level Packaging, Nanium, Retrieved on Oct. 4, 2017, Webpage available at: http://www.nanium.com/_upl/files/ewlb-nanium-141113162248.pdf.

Klekachev et al., "Graphene Transistors and Photodetectors", The Electrochemical Society Interface, vol. 22, No. 1, 2013, pp. 63-68.

Extended European Search Report received for corresponding European Patent Application No. 15161755.2, dated Sep. 15, 2015, 10 pages.

Office action received for corresponding European Patent Application No. 15161755.2, dated May 11, 2017, 9 pages.

International Search Report and Written Opinion received for corresponding Patent Cooperation Treaty Application No. PCT/FI2016/050131, dated May 11, 2016, 15 pages.

Dragoman M. et al. "Graphene-based quantum electronics", Progress in Quantum Electronics, Pergamon Press, Oxford, GB, vol. 33, No. 6, Nov. 2009, pp. 165-214.

* cited by examiner

METHOD AND APPARATUS FOR PROVIDING A TRANSISTOR

RELATED APPLICATION

This application was originally filed as PCT Application No. PCT/FI2016/050131 filed Mar. 3, 2016 which claims priority benefit from EP Patent Application No. 15161755.2 file Mar. 30, 2015.

TECHNOLOGICAL FIELD

Examples of the disclosure relate to a method and apparatus for providing transistors. In particular, examples of the disclosure relate to a method and apparatus for providing transistors such as a graphene field effect transistor.

BACKGROUND

Apparatus such as transistors are known. Transistors such as graphene field effect transistors may be used as sensors. For example the transistors may be configured to act as photo-sensors, X-ray sensors, infrared sensors bio-sensors, chemical sensors or any other suitable types of sensors.

Such apparatus are often required to be small enough to fit into other electronic devices such as communication devices. In some examples the transistors may be provided on semiconductor wafers or dies. It is useful to have reliable methods of providing such small scale apparatus.

BRIEF SUMMARY

According to various, but not necessarily all, examples of the disclosure there may be provided a method comprising: providing at least one electrode within a semiconductor layer wherein the semiconductor layer is provided on a first side of a wafer; thinning the wafer to produce a thinned wafer; providing graphene on a second side of the thinned wafer; attaching the semiconductor layer to an electrical interface on the first side of the thinned wafer; and providing at least one electrical connection from the graphene to the electrical interface so as to form a transistor comprising the at least one electrode and the graphene.

In some examples the wafer may be thinned to control the distance between the at least one electrode and the graphene.

In some examples the at least one electrode may provide a gate electrode for the transistor.

In some examples a plurality of electrodes may be provided within the semiconductor layer so that a plurality of transistors may be formed.

In some examples the transistor may form a sensor.

In some examples the graphene may comprise quantum dots.

In some examples the electrical interface may comprise a plurality of contacts on a dielectric layer. The plurality of contacts on the dielectric layer may extend outside the surface area of the semiconductor layer.

In some examples the semiconductor layer may comprise one or more integrated circuit components.

In some examples the method may further comprise providing a passivation layer. The passivation layer may cover at least part of the graphene.

In some examples the method may further comprise providing a casing around the transistor.

According to various, but not necessarily all, examples of the disclosure there may be provided an apparatus comprising: a transistor comprising at least one electrode provided within a semiconductor layer wherein the semiconductor layer is provided on a first side of a wafer; graphene wherein the graphene is provided on a second side of the wafer and wherein the wafer is thinned; an electrical interface on the first side of the thinned wafer; and at least one electrical connection from the graphene to the electrical interface.

In some examples the wafer may be thinned to control the distance between the at least one electrode and the graphene.

In some examples the at least one electrode may provide a gate electrode for the transistor.

In some examples a plurality of electrodes may be provided within the semiconductor layer so as to provide a plurality of transistors.

In some examples the transistor may be configured as a sensor.

In some examples the graphene may comprise quantum dots.

In some examples the electrical interface may comprise a plurality of contacts on a dielectric layer. In some examples the electrical connection may be configured so that the plurality of contacts on the dielectric layer extends outside the surface area of the semiconductor layer.

In some examples the semiconductor layer may comprise one or more integrated circuit components.

In some examples the apparatus may further comprise a passivation layer. The passivation layer may cover at least part of the graphene.

In some examples the apparatus may further comprise a casing provided around the transistor.

In some examples there may be provided an electronic device comprising an apparatus as described above.

According to various, but not necessarily all, examples of the disclosure there may be provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

The Figures illustrate example methods and apparatus 35. The method comprises: providing 11 at least one electrode 24 within a semiconductor layer 21 wherein the semiconductor layer is provided on a first side 22 of a wafer 14; thinning 13 the substrate 23 to produce a thinned wafer 14; providing 15 graphene 28 on a second side 26 of the thinned wafer 14; attaching 17 the semiconductor layer 21 to an electrical interface 30 on the first side of the thinned wafer 14; and providing 19 at least one electrical connection 32 from the graphene 28 to the electrical interface so as to form a transistor comprising the at least one electrode 24 and the graphene 28.

The method may be for providing a transistor 33. The methods may also enable wafer level packaging of the transistors 33. The apparatus 35 may be for supporting a transistor 33.

Examples of the disclosure provide a method of forming and wafer level packaged electronic device. In particular the disclosure may be used to form and package double sided graphene field effect transistors. The device may be double sided in that integrated circuit components may be provided on a first side 22 of a wafer 14 and a graphene channel may be provided on a second side 26. The first side of the wafer 14 may be an electrical side which may comprise electrical contacts. The second side 26 of the wafer 14 may be a sensor side which may comprise a sensing component configured to sense a parameter. The sensing side may be configured to detect any suitable parameter such as light, chemicals, biological materials, X-rays, infra-red rays or any other suitable parameters. The graphene field effect transistors according to examples of the disclosure may comprise a graphene channel on a first side and electrical contacts for the channel on the other side of the device.

Figure 1:
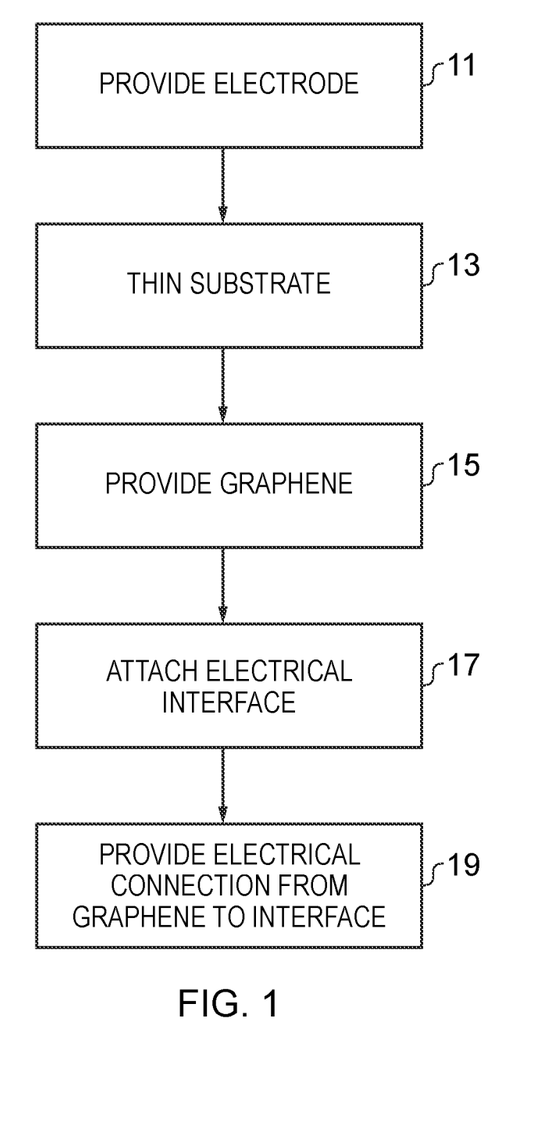
FIG. 1 illustrates a method.

FIG. 1 illustrates a method according to examples of the disclosure. The example method of FIG. 1 may be used to form an apparatus 35 such as a double sided graphene field effect transistor. The method may comprise at block 11 providing at least one electrode 24 within a semiconductor layer 21. The semiconductor layer 21 may be provided on a first side 22 of a wafer 14.

The method also comprises, at block 13, thinning the substrate 23 to produce a thinned wafer 14 and at block 15 providing graphene 28 on a second side 26 of the thinned wafer 14.

At block 17 the method comprises attaching the semiconductor layer 21 to an electrical interface 30 on the first side of the thinned wafer 14. The method also comprises, at block 19, providing at least one electrical connection 32 from the graphene 28 to the electrical interface 30 so as to form a transistor 33 comprising the at least one electrode 24 and the graphene 28.

The wafer 14 may be thinned so as to control the distance between the at least one electrode 24 and the graphene 28. This may enable the at least one electrode 24 to provide a gate electrode for the transistor 33.

It is to be appreciated that the illustration of a particular order to the blocks in FIG. 1 does not necessarily imply that there is a required or preferred order for the blocks and the order and arrangement of the block may be varied. Furthermore, it may be possible for some blocks to be omitted.

FIGS. 2A to 6E illustrate various methods, and apparatus 35 which may be provided by such methods, in more detail.

Figure 2A:
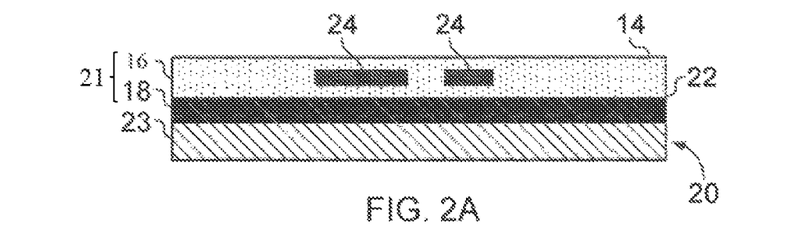
FIGS. 2A to 2D illustrate a method.

FIGS. 2A to 2D illustrate a method according to examples of the disclosure. FIG. 2A illustrates a die 20 which is used to form an apparatus 35. The die 20 may be formed by slicing a semiconductor wafer into smaller portions.

In FIG. 2A the die 20 comprises a wafer 14. The wafer 14 comprises a semiconductor layer 21 provided on a substrate 23. The semiconductor layer 21 may be provided overlaying the substrate 23 so that the substrate 23 supports the semiconductor layer 21. The semiconductor layer 21 is provided on a first side 22 of the substrate 23. In the example of FIG. 2A the semiconductor layer 21 is provided on a top side of the substrate 23.

In the example of FIG. 2A the semiconductor layer 21 comprises a metal stack 16. The metal stack 16 may comprise layers of metal provided between different dielectric layers. The semiconductor layer 21 may also comprise a semi-conductor portion 18. The semiconductor portion 18 may be provided underlying the metal stack 16.

The die 20 may comprise at least one electrode 24. In the example of FIG. 2A the at least one electrode 24 is provided within the semiconductor layer 21. The at least one electrode 24 may be provided within the metal stack 16. In some examples the at least one electrode 24 may be provided within the semiconductor portion 18. The at least one electrode 24 may be configured to provide a gate electrode for a transistor 33. The gate electrode may be configured to set and/or adjust an operating point of a transistor 33.

In some examples of the disclosure a plurality of electrodes 24 may be provided. The plurality of electrodes 24 may be configured to provide gate electrodes for a plurality of transistors 33. This may enable a plurality of transistors 33 to be formed on the same substrate 23. In some examples a plurality of gate electrodes may be provided for a single transistor 33. For instance, in the example of FIG. 2A two gate electrodes are provided. It is to be appreciated that any number of electrodes 24 may be provide in other examples of the disclosure.

In some examples the semiconductor layer 21 may also comprise integrated circuit components. The at least one electrode 24 and/or the other integrated circuit components may be formed within the semiconductor layer 21 while the semiconductor layer 21 is supported by the substrate 23. The at least one electrode 24 and/or the other integrated circuit components may be formed using any suitable technique.

The substrate 23 may be formed of any suitable material. In some examples the substrate 23 may be formed of a semiconductor material such as silicon, gallium arsenide, silicon carbide or any other suitable material.

In the example of FIG. 2A the substrate 23 is thicker than the semiconductor layer 21. In some examples of the disclosure the thickness of the wafer 14, including the substrate 23 and the semiconductor layer 21 may be in the range of 50-700 micrometers. The semiconductor portion 18 may be very thin, for example the semiconductor portion may be of the order of 0.1 micrometer to a few micrometers.

According to examples of the disclosure, once the at least one electrode 24 has been provided in the semiconductor layer 21 the wafer 14 may be thinned. In some examples the integrated circuit components may be provided in the semiconductor layer 21 before the wafer 14 is thinned. The wafer 14 may be thinned by mechanical grinding, chemical mechanical polishing, wet etching and atmospheric downstream plasma dry chemical etching or any other suitable technique. The technique which is used for thinning the wafer 14 may depend on the material which is used, the thickness of the wafer 14 which is needed and/or any other suitable factor.

Figure 2B:
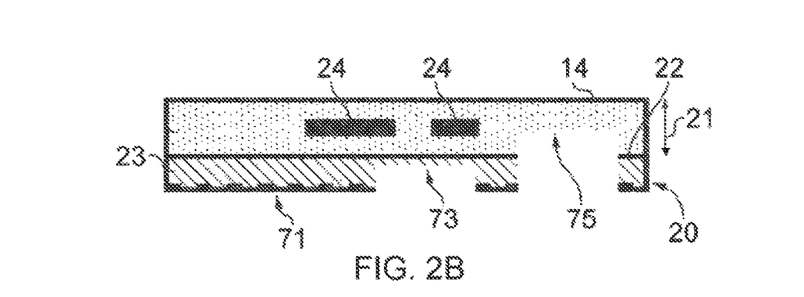

FIG. 2B illustrates different examples of thicknesses of the wafer 14. Three different examples of thinning of the wafer 14 are illustrated in FIG. 2B. It is to be appreciated that the three different levels are shown for illustrative purposes and that in actual implementations the wafer 14 would be thinned to a uniform thickness.

At point 71 of FIG. 2B only the substrate 23 of the wafer 14 is removed by the thinning process. The substrate 23 is thinned to the point where the semiconductor portion 18 starts or a point close to where the semiconductor portion 18 starts. At point 71 once the substrate 23 has been thinned the substrate 23 may be thinner than the semiconductor layer 21. In some examples the substrate 23 may be removed leaving only the semiconductor portion 18 and the metal stack 16.

At point 73 of FIG. 2B the substrate 23 and part of the semiconductor portion 18 of the wafer 14 are removed by the thinning process. The semiconductor portion 18 may be thinned to a point where a component such as a source or drain is located. This allows for a thinner wafer 14 than the example at point 71.

At point 75 of FIG. 2B the substrate 23, the semiconductor portion 18 and part of the metal stack 16 of the wafer 14 are removed by the thinning process. The metal stack 16 may be thinned to a point where a component such as a metal layer is located. This allows for an even thinner wafer 14 than the example at point 73.

After the thinning process the wafer 14 may have a thickness in the range of 0.5-50 micrometers.

Figure 2C:
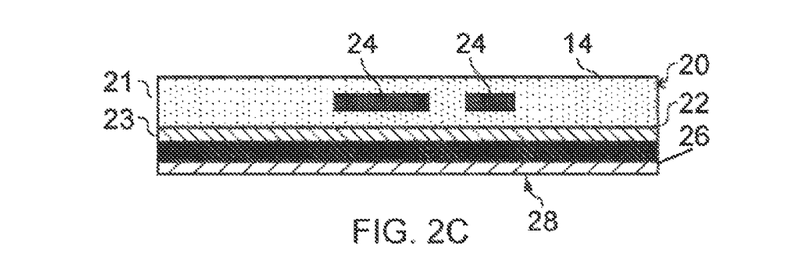

FIG. 2C illustrates the die 20 after the wafer 14 has been thinned. In the example of FIG. 2C the wafer 14 has been thinned to the point where the semiconductor portion 18 starts or a point close to where the semiconductor portion 18 starts. After the wafer 14 has been thinned a transistor may be formed on the wafer 14.

To form the transistor a postprocessing treatment may be applied to the wafer 14. The postprocessing treatment may prepare the wafer 14 for graphene 28 to be provided on the wafer 14. In examples of the disclosure the graphene 28 may be provide on a second side 26 of the wafer 14. The second side 26 may be on the opposite side of the wafer 14 to the first side 22. In the example of FIG. 2B the second side 26 is on the bottom side of the wafer 14. This enables a semiconductor layer 21 to be provided on one side of a wafer 14 and a layer of graphene 28 to be provided on the other side.

The preparation of the second side 26 of the substrate 23 may comprise any suitable technique such as polishing, dielectric growth, chemical activation or any other suitable technique.

Once the postprocessing treatment has been provided the graphene 28 may be provided on the second side 26 of the wafer 14. In some examples the graphene 28 may be grown on the substrate 23. In other examples the graphene 28 may be transferred onto the substrate 23.

The graphene 28 may be configured to provide a sensing portion. The resistance of the graphene 28 may vary in dependence of the presence of a physical parameter such as light, chemicals, biological materials, X-rays, infra-red rays or any other suitable parameters. The second side 26 of the wafer 14 may form a sensing side of the apparatus 35.

In some examples the graphene 28 may be provided in a thin layer. In some examples the graphene 28 may have a thickness in the range of nanometers. In some examples the graphene 28 may comprise an atomic monolayer.

As the substrate 23 has been thinned this allows for a small separation between the graphene 28 and the at least one electrode 24. This may enable the graphene 28 to be used as a channel within a field effect transistor 33.

Once the graphene 28 has been provided onto the substrate 23 it may be patterned. The graphene 28 may be patterned to form channels for one or more transistors 33. The graphene 28 may be patterned using methods such as laser ablation or any other suitable technique.

Figure 2D:
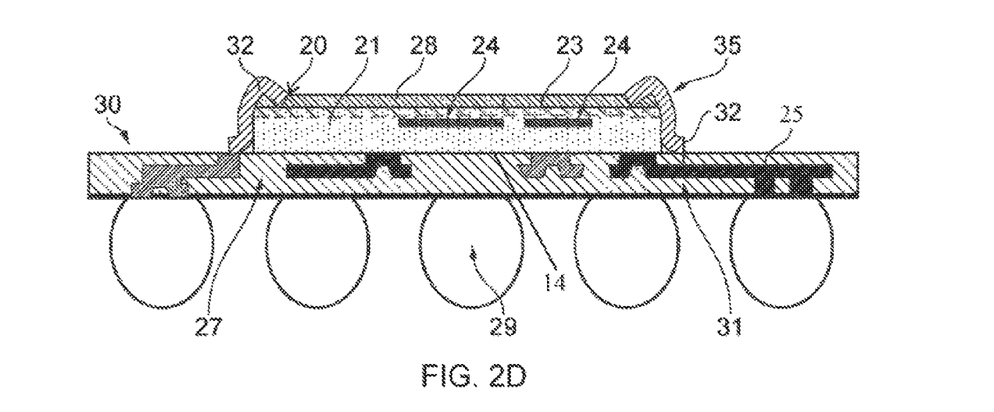

Once the graphene 28 has been patterned the die 20 may be inverted to enable an electrical interface 30 to be attached. FIG. 2D illustrates an example apparatus 35 after an electrical interface 30 has been attached to the die 20. In the example of FIG. 2D the graphene 28 and the second side 26 of the wafer 14 are now the on top side of the wafer 14 and the semiconductor layer 21 and the first side 22 are now on the bottom side of the wafer 14.

In the example of FIG. 2D the semiconductor layer 21 may be attached to an electrical interface 30. The electrical interface 30 may be connected on the first side 22 of the wafer 14. The electrical interface 30 may be connected to the semiconductor layer 21 so that the semiconductor layer 21 is positioned between the wafer 14 and the electrical interface 30. The first side 22 of the wafer 14 may form an electrical side of the apparatus 35.

The electrical interface 30 may comprise any means which enables electronic components within the semiconductor layer 21 to be connected to other electronic components. For instance the electrical interface 30 may be configured to enable a gate voltage to be provided to the at least one electrode 24. In some examples the electrical interface 30 may enable components of the integrated circuitry to be connected to other electronic components.

In the example of FIG. 2D the electrical interface 30 comprises a dielectric layer 27 and a plurality of electrical connections 28. The plurality of electrical connections may extend from the semiconductor layer 21 to contacts 29 on the surface of the dielectric layer 27.

In the example of FIG. 2D a plurality of contacts 29 are provided on the surface of the dielectric layer 27. The contacts 29 may comprise any means which may be configured to enable the electronic components of the apparatus 35 to be connected to other electrical components. The contacts 29 may comprise solder balls or any other suitable means.

In the example of FIG. 2D the electrical interface 30 is a fan out interface in which the contacts 29 on the surface of the dielectric layer 27 extend outside the surface area of the semiconductor layer 21. The electrical connections 29 within the dielectric layer 21 may extend outwards from the semiconductor layer 21. In other example the electrical interface 30 could have the same surface area as the semiconductor layer 21.

In some examples a solder stop 31 may be provided on the dielectric layer 27. The solder stop 31 may comprise any means which may be configured to prevent short circuits between the contacts 29. In some examples the solder stop 31 may comprise a layer of polymer or other insulating material. In some examples the solder stop 31 may be removed from the dielectric layer 27 after the contacts 29 has been formed.

In the example of FIG. 2D five contacts 29 are provided on the surface of the dielectric layer 27. It is to be appreciated that any number of contacts 29 may be provided in other examples of the disclosure.

At least one electrical connection 32 is provided from the graphene 28 to the electrical interface 30. In the example of FIG. 2D two electrical connections 32 are provided from the graphene 28 to the electrical interface 30. The electrical connections 32 may comprise a conductive material such as gold, aluminium, copper, aluminium silicate or any other suitable material. The electrical connections 32 may extend from the graphene 28 and around the side of the dielectric layer 27 to the connections 29 within the electrical interface 30. The electrical connections 32 may extend directly from the graphene 28 to the electrical interface 30 without the need for a through silicon via (TSV).

In the example of FIG. 2D the electrical connections 32 may be configured to provide electrodes for a transistor 33. For instance a first electrical connection 32 may comprise a source electrode and a second electrical connection 32 may provide a drain electrode. The graphene 28 may provide a channel between the source and drain electrodes. This may enable the graphene 28 and the at least one electrode 24 to form a transistor 33 such as a graphene field effect transistor.

In the example of FIG. 2D only one transistor 33 is provided. It is to be appreciated that any number of transistors may be provided in other examples of the disclosure. In some examples one or more of the transistors 33 may share a common electrode.

As the substrate 23 has been thinned this reduces the overall thickness of the apparatus 35. This reduces the separation of the graphene 28 from the electrical interface 30 and so reduces the length of the electrical connections 32 which are needed. Reducing the length of the electrical connections 32 may improve the performance of the transistor 33 as it may reduce noise and increase sensitivity.

The example graphene field effect transistor could be used as a sensor such as a photosensors, an x-ray sensor, an infrared sensor or other suitable type of sensor.

The methods therefore enable an apparatus 35 to be provided. The apparatus 35 comprises a transistor 33 comprising at least one electrode 24 provided within a semiconductor layer 21 wherein the semiconductor layer 21 is provided on a first side 22 of a wafer 14; graphene 28 wherein the graphene 28 is provided on a second side 26 of the wafer 14 and wherein the wafer 14 is thinned; an electrical interface 30 on the first side of the thinned wafer 14; and at least one electrical connection 32 from the graphene to the electrical interface 30.

This provides a small scale transistor apparatus 35 which allows for wafer level packaging. The apparatus 35 may be filled with epoxy mold in a wafer level packaging process.

Figure 3A:
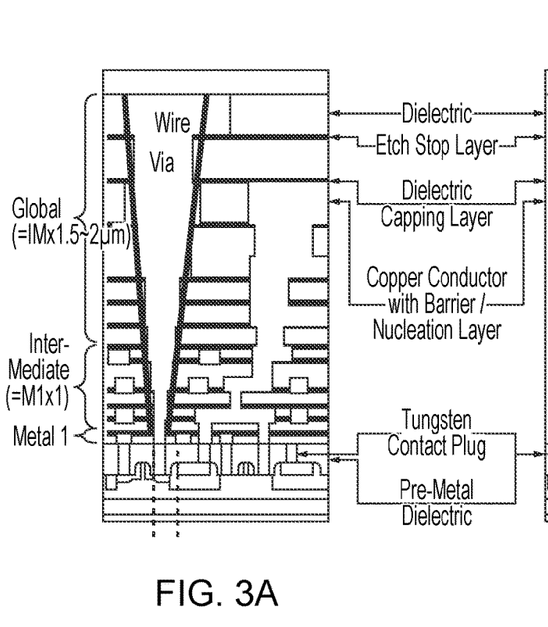
FIGS. 3A and 3B illustrate example integrated circuits.
Figure 3B:
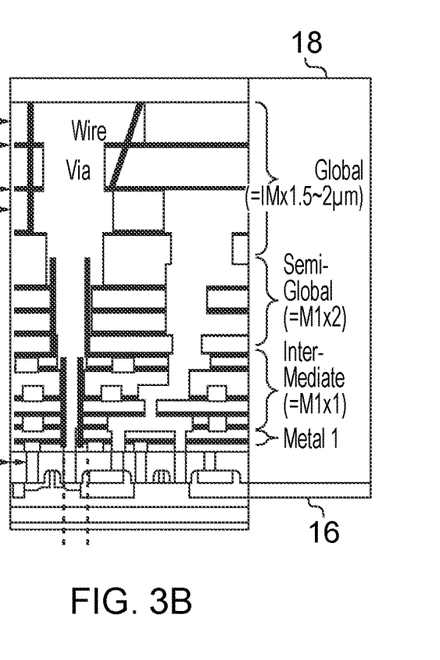

FIGS. 3A and 3B illustrate example integrated circuits which may be used in examples of the disclosure. The integrated circuits may be provided within the semiconductor layer 21. The integrated circuits may comprise a metal stack 16 and a semiconductor portion 18. The integrated circuits may provide any suitable sort of device. FIG. 3A illustrates a cross section of an example micro processing unit and FIG. 3B illustrates a cross section of an examples application specific integrated circuit (ASIC).

Each of the example integrated circuits may comprise a plurality of different circuit components. The circuit components may be provided on different levels within the semiconductor layer 21. The metal stack 16 may comprise one or more conductive layers which may provide the at least one electrode 24. For instance the at least one electrode 24 may be formed from the lowest metal or conductive layer within the integrated circuits. The conductive layer could be a base layer, such as a diffusion layer or well in a CMOS processor or any other suitable component within the integrated circuit.

In some examples the semiconductor portion 18 may comprise components such as source, drain, emitter, collector, wells or any other suitable components. The components which are provided in the semiconductor portion 18 may be determined by the process of the integrated circuits. In some examples the semiconductor portion 18 may comprise the one or more electrodes 24.

The integrated circuits may be formed within the semiconductor layer 21 before the substrate 23 is thinned. The integrated circuits may be formed using any suitable techniques.

Figure 4:
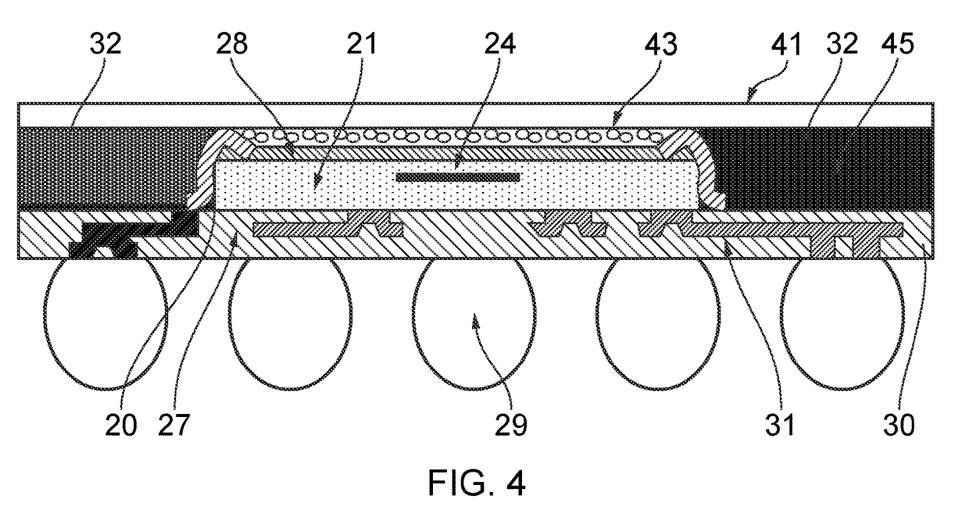
FIG. 4 illustrates an example apparatus comprising a passivation layer.

FIG. 4 illustrates an example apparatus 35 comprising a passivation layer 41. The apparatus 35 may comprise a transistor 33. The transistor 33 may be a graphene field effect transistor and may be formed using the example methods described above. Corresponding reference numerals are used for corresponding features.

In the example of FIG. 4 only one electrode 24 is provided within the semi conductor layer 21. It is to be provided that any other number of electrodes 24 could be provided in other examples of the disclosure.

In the example of FIG. 4 the transistor 33 is configured to act as a sensor. In the example of FIG. 4 quantum dots 43 are provide within and/or adjacent to the graphene 28. In the example of FIG. 4 the transistor 33 comprises a layer of graphene 28 covered by a thin layer of quantum dots 43. The quantum dots 43 may comprise a nanocrystal in which there is quantum confinement in all three dimensions. The quantum dots 43 may be configured to produce a change in electric charge in response to a detected parameter.

The quantum dots 43 may increase the sensitivity of the transistor 33. In some examples the quantum dots 43 may convert a detected parameter, such as an incident photon, into electrical charge. The electrical charge may then change the conductivity of the graphene 28 channel which produces a measureable electrical response.

The quantum dots 43 which are used may depend upon the parameter which is to be detected by the transistor 33. In some examples the quantum dots 43 may be configured to sense incident electromagnetic radiation. The wavelength of the radiation which is detected may depend on the size of the quantum dots 43 and/or the material used for the quantum dots 43. For example PbS quantum dots 43 may be used to detect incident electromagnetic radiation such as X-rays or visible light. Graphite quantum dots 43 or other suitable material may be used to detect infra red electromagnetic radiation.

The apparatus 35 also comprises a passivation layer 41. The passivation layer 41 may comprise any means which may be configured to coat the graphene 28 and the quantum dots 43 to protect them from environmental parameters. In some examples the passivation layer 41 may encapsulate the apparatus 35. The passivation layer 41 may be configured to increase the lifetime of the apparatus 35.

In the example of FIG. 4 passivation layer 41 is provided overlaying the graphene 28 and quantum dots 43. The passivation layer 41 is provided on the second side 26 of the wafer 14. The passivation layer 41 is provided so that it is on the same side of the wafer 14 as the graphene 28.

The passivation layer 41 may be transparent to the parameter which is to be detected by the transistor 33. For instance, in examples where the transistor 33 is configured to detect X-rays, the passivation layer 41 may allow X-rays to pass through but may be configured to prevent fluids or other contaminants from reaching the graphene 28 and quantum dots 43.

The passivation layer 41 may comprise any suitable material. The material which is used may depend on the parameter which the transistor 33 is intended to detect. The passivation layer 41 could comprise $Al_2O_3$, $SiO_2$, $Si_3N_4$ or any other material or combinations of such materials.

In the example of FIG. 4 the passivation layer 41 extends to the edge of the electrical interface 30. The passivation layer 41 may cover the same surface area as the electrical interface 30. This may enable the passivation layer 41 layer to be the same size as the package. In other examples the passivation layer 41 may cover only the surface area of the die 20 or may have a size between the surface area of the die and the surface area of the electrical interface 30.

In the example of FIG. 4 the apparatus 35 also comprises a molding portion 45. The molding portion 45 may comprise any material which may be provided around the die 20 to protect the die 20 from bending or deformation or other types of damage. The molding portion 45 may be formed from ceramics or metals or any other suitable materials. In some examples the molding portion 45 might not be provided.

Figure 5:
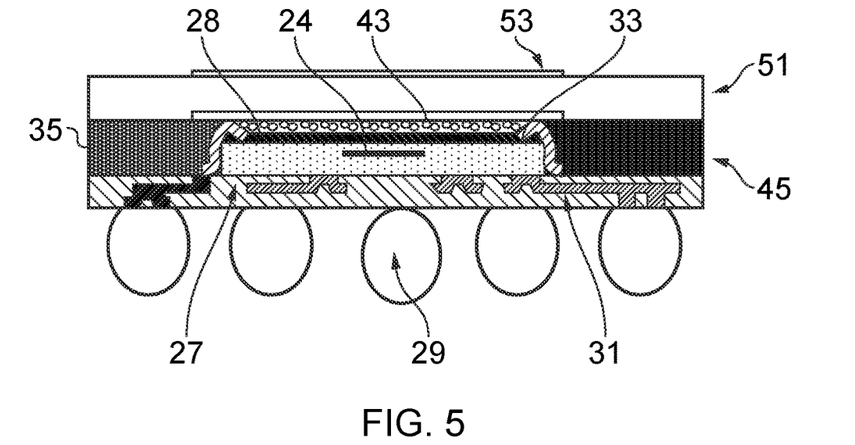
FIG. 5 illustrates example apparatus comprising a casing.

FIG. 5 illustrates example apparatus comprising a casing 51. The apparatus 35 may comprise a transistor 33, passivation layer 41 and molding portion 45 as described above. Corresponding reference numerals are used for corresponding features.

In the example of FIG. 5 only one electrode 24 is provided within the semi conductor layer 21. It is to be provided that any other number of electrodes 24 could be provided in other examples of the disclosure.

In the example of FIG. 5 the transistor 33 comprises a layer of graphene 28 covered by a thin layer of quantum dots 43 as described above in relation to FIG. 4. It is to be appreciated that other configurations of the transistor 33 may be used in other examples of the disclosure.

In the example of FIG. 5 the passivation layer 41 extends over the graphene 28 and the quantum dots 43. The passivation layer 41 only covers the surface area of the die 20 and does not extend to the edges of the electrical interface 30. This may provide sufficient protection for the graphene 28 and quantum dots 43 but may reduce the thickness and or materials needed to form the apparatus 35

In the example of FIG. 5 the apparatus 35 also comprises a casing 51. The casing 51 may be configured to protect the transistor 33. In some examples the casing 51 may be configured to encapsulate the apparatus 35. The casing 51 may be hermetic or non-hermetic. In examples where the casing is hermetic an inert gas such as argon may be sealed into the casing 51.

The casing 51 may comprise a window 53. The window 53 may be a portion of the casing 51 which is transparent to the parameter which is to be detected by the transistor 33. For instance where the transistor 33 is configured to detect a electromagnetic radiation of a given frequency range the window 53 may be transparent to electromagnetic radiation within that frequency range. For instance the window 53 could be transparent to X-rays or infra red radiation or any other suitable parameter.

The window 53 may be arranged so that it overlays the graphene 28 and the quantum dots 43. In some examples more than one window 53 may be provided within the casing 51. In such examples different windows may be provided overlaying different transistors 33.

FIGS. 6A to 6E illustrate an example method of packaging an apparatus 35 such as the example apparatus of FIG. 5. Corresponding reference numerals are used for corresponding features.

Figure 6A:
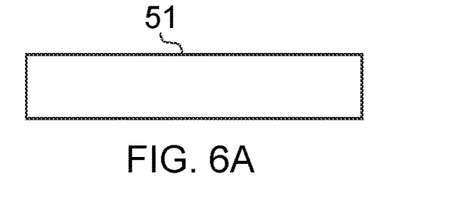
FIGS. 6A to 6E illustrate an example method of packaging an apparatus.
Figure 6B:
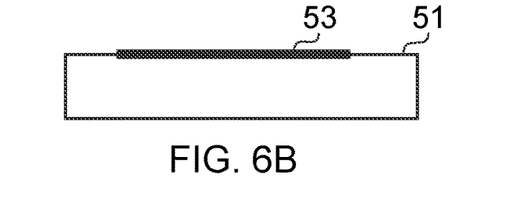

In FIG. 6A a casing 51 is provided and in FIG. 6B a window 53 is provided within the casing 51.

Figure 6C:
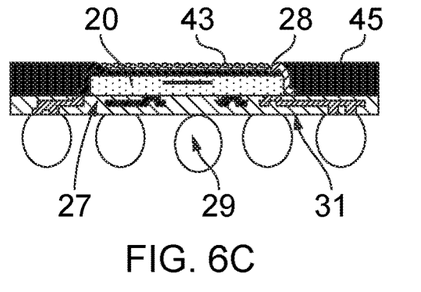
Figure 6D:
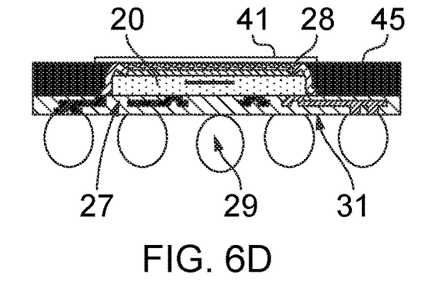

In FIG. 6C a transistor 33 is provided on a die 20. The transistor 33 may be formed using methods as described above. In FIG. 6C a molding portion 45 is provided around the die 20. In FIG. 6D a passivation layer 41 is provided over the graphene 28 and quantum dots.

The example methods of FIGS. 6A to 6B may be performed in parallel to the methods of FIGS. 6C and 6D. This makes the packaging of the apparatus 35 faster and more efficient.

Figure 6E:
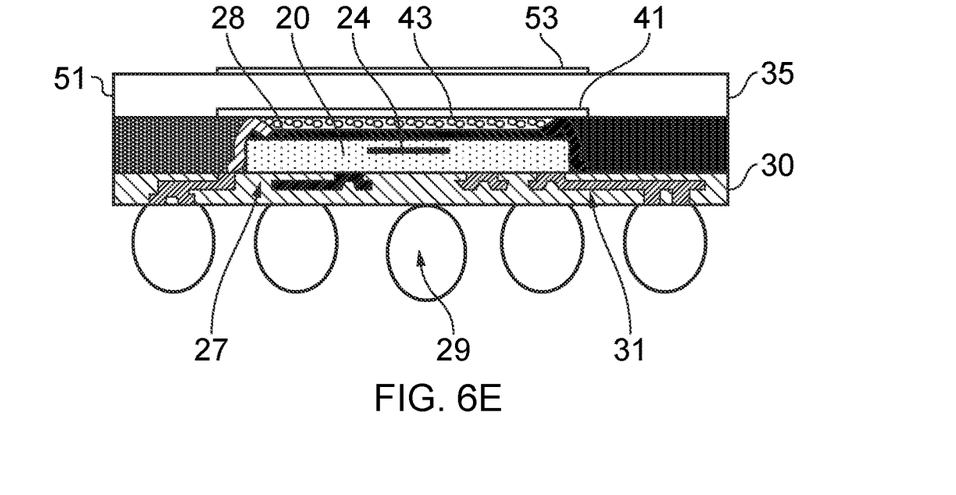

In FIG. 6E the transistor 33 is combined with the casing 51 to provide an apparatus 35 as described above.

In the example of FIGS. 6A to 6E the molding portion 45 is formed around the die 20 in FIG. 6C. In other examples the molding portion 45 could be provided around the casing 51 in FIG. 6A or 6B.

The examples and methods described enable double sided transistors, such as graphene field effect transistors, to be provided. The methods enable the transistors 33 to be combined with integrated circuit components by providing the graphene 28 channel on an opposite side of the wafer 14 to the integrated circuit. This reduces the number of substrates needed and miniaturises the apparatus 35 and reduces the number of interconnections needed. This may also reduce latencies in the transistors 33 as read out circuitry. This may be particularly beneficial for resistive sensors 33 such as graphene field effect transistors as these are typically slower than diode based sensors.

The examples and methods also allow for wafer level packaging of the apparatus 35.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the disclosure have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a transistor comprising at least one electrode provided within a layer, the layer comprising a semi-conductor portion and a metal stack; wherein the layer is directly below a first side of a substrate;

graphene wherein the graphene is directly above a second side of the substrate enabling the graphene to be used as a channel within the transistor;

an electrical interface on the layer; and at least one electrical connection from the graphene to the electrical interface.

2. An apparatus as claimed in claim 1 wherein the at least one electrode provides a gate electrode for the transistor.

3. An apparatus as claimed in claim 1 wherein a plurality of electrodes are provided within the semiconductor layer so as to provide a plurality of transistors.

4. An apparatus as claimed in claim 1 wherein the transistor is configured as a sensor.

5. An apparatus as claimed in claim 1 wherein quantum dots are provided adjacent to the graphene.

6. An apparatus as claimed in claim 1 wherein the electrical interface comprises a plurality of contacts on a dielectric layer wherein the plurality of contacts on the dielectric layer extend outside the surface area of the layer.

7. An apparatus as claimed in claim 1 wherein the layer comprises one or more integrated circuit components.

8. An apparatus as claimed in claim 1 further comprising a passivation layer wherein the passivation layer covers at least part of the graphene.

9. An apparatus as claimed in claim 1 further comprising a casing around the transistor.

10. An electronic device comprising:

a transistor comprising at least one electrode provided within a layer, the layer comprising a semi-conductor portion and a metal stack; wherein the layer is directly below a first side of a substrate;

graphene wherein the graphene is directly above a second side of the substrate enabling the graphene to be used as a channel within the transistor;

an electrical interface on the layer; and at least one electrical connection from the graphene to the electrical interface.

\* \* \* \* \*